US010877232B1

(12) United States Patent
Bailey et al.

(10) Patent No.: US 10,877,232 B1
(45) Date of Patent: Dec. 29, 2020

(54) CONNECTOR FOR MULTIPLE CABLING ARRANGEMENTS

(71) Applicant: Amazon Technologies, Inc., Seattle, WA (US)

(72) Inventors: Kevin Bailey, Seattle, WA (US); Shay Madar, Netanya (IL); Priscilla Lam, Seattle, WA (US); David Ben-Dror, Alon Hagalil (IL); Robert Klein, Kfar Tavor (IL); Charles Caldwell Phares, Seattle, WA (US); Darin Lee Frink, Lake Tapps, WA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 15/969,708

(22) Filed: May 2, 2018

(51) Int. Cl.
| | |
|---|---|
| *H05K 7/14* | (2006.01) |
| *G02B 6/42* | (2006.01) |
| *H01R 13/627* | (2006.01) |
| *H01R 12/71* | (2011.01) |
| *H01R 13/506* | (2006.01) |
| *H01R 13/639* | (2006.01) |
| *H01R 12/70* | (2011.01) |

(52) U.S. Cl.
CPC ......... *G02B 6/4284* (2013.01); *H01R 12/716* (2013.01); *H01R 13/506* (2013.01); *H01R 13/6272* (2013.01); *H01R 13/639* (2013.01); *H05K 7/1429* (2013.01); *H01R 12/7064* (2013.01)

(58) Field of Classification Search
CPC .......... G02B 6/4284; H01R 13/6272; H01R 13/506; H01R 12/716; H01R 13/639; H01R 12/7064; H05K 7/1429
See application file for complete search history.

(56) References Cited

U.S. PATENT DOCUMENTS

| | | | |
|---|---|---|---|
| 6,498,890 B1* | 12/2002 | Kimminau | G02B 6/43 385/134 |
| 6,600,865 B2 | 7/2003 | Hwang | |
| 6,692,231 B1 | 2/2004 | Calvert | |
| 7,753,712 B2* | 7/2010 | Miki | H01R 13/6582 439/353 |
| 7,896,659 B1 | 3/2011 | Westman et al. | |
| 8,926,199 B1* | 1/2015 | Chan | G02B 6/4249 385/93 |
| 9,160,822 B2* | 10/2015 | Joseph | H01R 31/06 |

(Continued)

*Primary Examiner* — Rockshana D Chowdhury
(74) *Attorney, Agent, or Firm* — Kilpatrick Townsend & Stockton LLP

(57) ABSTRACT

An electrical connection system can include a cage and/or a corresponding cable. The cage can be formed by walls and define faces on the top, bottom, right, left, front, and rear. A rear portion can house a receiving portion of a connector interface, which can be engaged via insertion of a module through the front face, or alternately by insertion of a plug through the top face. The cable at a terminating end can include the plug, which may include a vertical upright column and a horizontal base that includes an insertion portion of the connector interface. The cable at an originating end can include another instance of the receiving portion of the connector interface. A retainer can be provided to retain the plug in engagement with the receiving portion of the connector in the cage. The retainer can include a cover or other structure on the cable and/or cage.

21 Claims, 6 Drawing Sheets

(56) References Cited

U.S. PATENT DOCUMENTS

| | | | |
|---|---|---|---|
| 9,739,944 B1* | 8/2017 | Fermor | G02B 6/4292 |
| 9,915,560 B2 | 3/2018 | Ho | |
| 10,153,571 B2 | 12/2018 | Kachlic | |
| 10,588,243 B2 | 3/2020 | Little | |
| 2006/0063435 A1* | 3/2006 | Evans | H01R 13/44 |
| | | | 439/680 |
| 2012/0003848 A1 | 1/2012 | Casher et al. | |
| 2014/0185988 A1* | 7/2014 | Qi | G02B 6/4278 |
| | | | 385/77 |
| 2015/0147895 A1* | 5/2015 | Hanna | H04L 49/25 |
| | | | 439/62 |
| 2017/0077643 A1 | 3/2017 | Zbinden et al. | |
| 2019/0319395 A1 | 10/2019 | Bakshan et al. | |
| 2019/0326703 A1 | 10/2019 | Chen | |

\* cited by examiner

CONNECTOR FOR MULTIPLE CABLING ARRANGEMENTS

BACKGROUND

Datacenters house collections of servers and networking hardware, including switches and routers. Often many different cabled connections between components in a particular device chassis are used to connect the components. Generally, having many different types of cable connectors increases cost and operational complexity. On the other hand, cable connectors need to satisfy a wide array of cabling scenarios.

BRIEF DESCRIPTION OF THE DRAWINGS

Various embodiments in accordance with the present disclosure will be described with reference to the drawings, in which.

DETAILED DESCRIPTION

Figure 1:
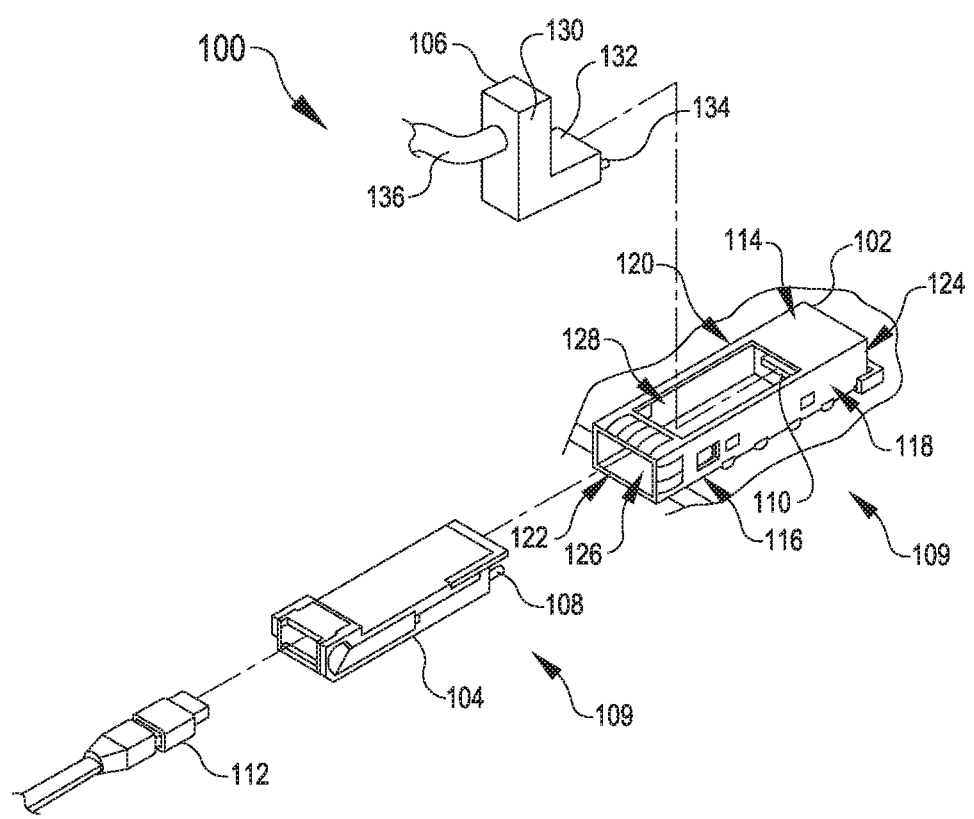
FIG. 1 is a perspective view of a cage for a cabling connection and different options of plugs that can be received therein in accordance with various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to cabling arrangements and associated components for computing equipment, such as may be used in data centers or other locations. The cabling arrangements can include plugs and associated receptacles that may be capable of receiving plugs through different access points to permit engagement with a single connector interface within the receptacle. For example, the receptacle may include a shell or cage featuring an opening on one end that allows lengthwise insertion of a plug into the cage to guide and facilitate alignment of the plug as it travels in the lengthwise direction to engage pins or other structure of a connector interface at an opposite end of the length of the cage. The cage can also feature an opening in a top of the cage that can permit a different variety of plug to be inserted through the top of the cage. For example, following vertical insertion downward through the top of the cage, the plug may be translated forward (e.g., in the lengthwise direction) to bring a lower portion of the plug into engagement with the pins or other structure of the connector interface at the interior end of the cage. Thus, the pins or other structure of the connector interface—although a fixed, single, unchanging structure—may receive either the end-insertable plug or the top-insertable plug.

Use of the cage that includes both a top opening and an end opening for receiving different varieties of plugs may allow the cage and associated connector interface therein to be more versatile with the types of plugs or cables that can be received. As a result, cost savings may be obtained due to fewer costs from generating different kinds of cages (e.g., one cage with only a top-accessible opening and another cage with only an end-accessible opening). Moreover, use of cages that are capable of both end-insertion and top-insertion of plugs may facilitate arrangements that otherwise may be unachievable, such as due to constraints of space needed if only end-insertion were viable (or if only top-insertion were viable). As an illustrative example, such dual-purpose cages may facilitate an arrangement in which a pair of similar expansion cards can be installed facing different directions within a shared server chassis, e.g., with one expansion card receiving an end-inserted plug while a similar but opposite-facing expansion card receives a top-inserted plug within a space that is otherwise too crowded with other components to permit end-insertion.

In an illustrative example, the top-insertable plug may include an L-shaped connector. The L-shaped connector can include a lower portion (e.g., a horizontally-arranged portion) that engages with the connector interface within the cage when the plug is fully seated. The L-shaped connector can also include an upper portion (e.g., a vertically arranged portion) that may extend upward out of the top opening of the cage when the plug is fully seated. In various aspects, use of the L-shaped connector (e.g., with a portion thereof extending up out of the cage rather than out an opposite lengthwise end of the cage) can reduce an amount of space outside of the cage in a lengthwise direction that could otherwise be needed to establish connection through the cage. For example, whereas an end-insertable plug may require a specific amount of space adjacent to the longitudinal end opening of the cage (e.g., behind the cage) so that there is room in which to accommodate a cable bend radius of the end-insertable plug, such a minimum offset in the lengthwise direction from the longitudinal end opening of the cage may be unnecessary for an L-shaped connector that allows a bend radius of a cable of a top-insertable plug to be situated elsewhere (e.g., over the cage).

In some embodiments, the top-insertable plug is part of an adaptor that facilitates conversion from end insertion to top insertion. For example, an L-shaped connector may be coupled with a terminating end of a cable and provide top insertion capability at the terminating end. The opposite, originating end of the cable may include a cage that permits end-insertion. Thus, in an illustrative example, an expansion card having a cage positioned too close to other components to permit end insertion may nonetheless be connected to an end-insertable plug by use of an adaptor cable that features a cage at the originating end of the cable (to receive the end-insertable plug) and an L-shaped connector of a top-insertable plug at the terminating end of the cable (to engage through a top opening instead of through an end opening of the cage feeding the expansion card).

Referring now to the figures, FIG. 1 depicts a cabling product or a cabling arrangement 100. The cabling arrangement 100 may provide a suitable conduit for transfer of electrical power, data, and/or other signals between appliances (such as between servers and/or network hard drive components for a data center). The cabling arrangement 100 in FIG. 1 features a cage 102. The cage 102 in FIG. 1 includes features that allow alternate engagement of different varieties of plugs, specifically a first plug 104 and a second plug 106.

The first plug 104 in FIG. 1 is associated with a cable 112. For example, the cable 112 may be releasably connected with the first plug 104. The first plug 104 in FIG. 1 can include a transceiver or other appropriate structure for establishing sufficient connection between the first plug 104 and structure of or within the cage 102 for transferring data, power, etc. between the cable 112 and a respective appliance fed by the cage 102. The first plug 104 may correspond to any suitable form factor of pluggable transceiver. For example, the body and other components of the first plug 104 may be sized and arranged to meet any suitable standard for pluggable optical transceivers. In one non-limiting example, the first plug 104 may correspond to a small form-factor pluggable (SFP) transceiver, such as is commonly used for telecommunication and/or data communications applications. In another non-limiting example, the first plug 104 comprises an enhanced small form-factor pluggable (SFP+) transceiver or a compact small form-factor pluggable (CSFP) transceiver. In an additional non-limiting example, the plug 104 comprises an RJ45 connector or a similar connector. Further non-limiting examples may include QSFP, QSFP+, QSFP28, QSFP56, QSFP56-DD, OSFP, or other standards that may be known in the art.

The first plug 104 in FIG. 1 includes an insertion portion 108 of a connector interface 109 that can mate with a receiving portion 110 of the connector interface 109. The connector interface 109 can correspond to the combination of the insertion portion 108 and the receiving portion 110, e.g., such that engagement of the insertion portion 108 and the receiving portion 110 can complete connection of the connector interface 109 to allow transmission of power and/or data thereby. The receiving portion 110 of the connector interface 109 is shown positioned within the cage 102.

The cage 102 includes sidewalls that define respective faces of the cage 102, specifically, a top face 114, a bottom face 116, a left face 118, a right face 120, a front face 122, and a rear face 124. The orientation of these faces is described specifically with respect to the cage 102 and may differ from an orientation of an environment in which the cage 202 is implemented (such as the server chassis assembly 240 referenced below with respect to FIG. 2). For example, the rear face 124 of the cage 102 is not limited to a particular orientation relative to the rear of the server chassis assembly 240, but depending on desired placement in implementation, may be suitably adjacent or remote relative to the rear of the server chassis assembly 240 or may face toward, away, partially toward, or partially away from the rear of the server chassis 240. In FIG. 1, the front face 122 includes a front opening 126 that provides access in a longitudinal direction into the interior of the cage 102. The top face 114 in FIG. 1 includes a top opening 128 that provides access into the interior of the cage 102 from a top-down or vertical direction. The respective faces of the cage 102 in various aspects are defined by or correspond to respective side walls, such that side walls are not provided separate reference numbers herein from the respective faces. In various aspects, the respective faces and/or walls of the cage 102 extend parallel to the receiving portion 110 of the connector interface 109.

The front opening 126 can permit insertion of the first plug 104 through the front face 122 of the cage 102 to allow the insertion portion 108 and the receiving portion 110 of the connector interface 109 to engage with one another. The receiving portion 110 can be suitably coupled to a circuit board or other electrical appliance to provide electrical connection to plugs or cables received in the cage 102 such as the first plug 104 or the second plug 106.

The second plug 106 in FIG. 1 has an upper portion 130 and a lower portion 132. The upper portion 130 and the lower portion 132 can be arranged such that the second plug 106 is L-shaped. In some aspects, the L-shape is a right-angle connector, e.g., with the column 130 oriented at a right angle to the base 132, although other orientations aside from strictly perpendicular may be examples of L-shaped as used herein. The upper portion 130 may alternatively be referred to herein as column 130. In some aspects, the column 130 may correspond a vertical upright column. The lower portion 132 may alternatively be referred to herein as base 132. In some aspects, the base 132 may correspond to a horizontal lengthwise base. Although a rectangular cross-section is depicted for each of the column 130 and base 132, other forms of cross-section may also be utilized (including, but not limited to, round and/or non-uniform) and the cross-sectional size and/or shape of the column 130 may differ or be the same as that of the base 132.

The column 130 can be coupled with or be a termination point for a cable 136. The base 132 can include an insertion portion 134 of the connector interface 109. For example, the connector interface 109 may correspond to a combination of the insertion portion 134 on the second plug 106 and the receiving portion 110 within the cage 102. In use, the second plug 106 may be inserted through the top opening 128 in the top face 114 of the cage 102 (e.g., initially moved in a vertical direction) and then translated in the lengthwise direction of the cage 102 in order to cause the respective portions of the connector interface 109 to engage one another (e.g., such that the insertion portion 134 on the base 132 engages the receiving portion 110 in the cage 102).

Inclusion of the front opening 126 and the top opening 128 may accordingly allow the cage 102 to alternatively receive different varieties of the plugs 104 and 106 and allow a versatility of cabling options notwithstanding use of a single component structure of the cage 102.

Figure 2:
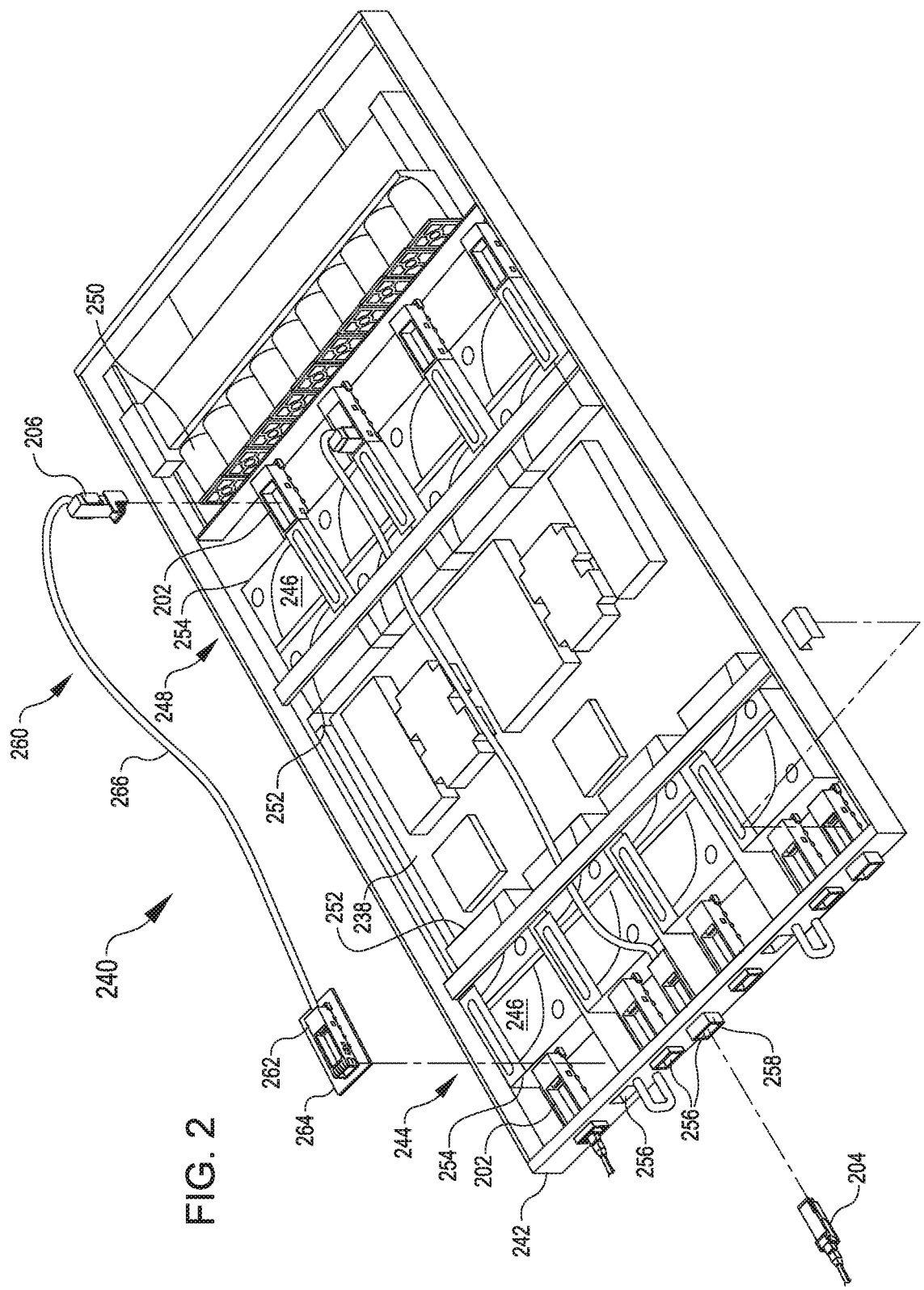
FIG. 2 illustrates a server chassis assembly that includes various instances of the cage of FIG. 1 in accordance with various embodiments.

FIG. 2 illustrates an environment in which the cage 102 from FIG. 1 may be utilized. FIG. 2 depicts a server chassis assembly 240. The assembly 240 includes a front wall 242, a front row 244 of expansion cards 246, a circuit board 238, a second row 248 of expansion cards 246, and a bank of fans 250. In some aspects, the expansion cards 246 may correspond to media storage drives or other appliances configured to couple with the circuit board 238 to expand functionality of the circuit board 238.

In FIG. 2, each of the expansion cards 246 includes a respective proximal end 252 coupled with the circuit board 238. For example, the proximal end 252 may include appropriate pin connectors or other variety of connectors to provide electrical connection for transmission of power and/or data between the circuit board 238 and the expansion cards 246.

Expansion cards 246 can each respectively also include a distal end 254 opposite the proximal end 252. The distal end 254 can be coupled with a corresponding cage 202 (which can be an example of the cage 102 of FIG. 1). In various examples, the combination of the cage 202 and expansion card 246 from the front row 244 and the second row 248 may be replicas of one another (e.g., a single-stock-keeping unit or SKU), which may reduce costs of inventory management and/or production while also providing versatility to permit the combination of the cage 202 and expansion card 246 to be installed in different directions or orientations within the server chassis assembly 240.

The cage 202 can provide access for a respective plug to be engaged to provide electrical connection to the expansion card 246. For example, cages 202 that are associated with the front row 244 of expansion cards 246 may extend between and span a distance between the expansion cards 246 and the front wall 242. The cages 202 for the front row 244 may face toward the front wall 242 and may be aligned with apertures 256 in the front wall 242, which may form portions of ports 258 through which connection may be made with the expansion card 246 via a first plug 204 (which may be an example of the first plug 104 of FIG. 1).

The cages 202 associated with the second row 248 may face away from the front wall 242. This orientation (e.g., in which cages 202 for the front row 244 face the opposite direction from cages for the second row 248) may be a result of the circuit board 238 being arranged with opposite facing interfaces for receiving the expansion cards 246 of the front row 244 and the second row 248.

In some aspects, the fans 250 are constrained to be located at a particular position within or relative to the server chassis assembly 240, for example, based on a layout of the circuit board 238, a size of the overall server chassis assembly 240, and/or other criteria. Accordingly, in some aspects, the mandated position of the fans 250 may cause there to be insufficient space adjacent the cages 202 for the second row 248 to permit end insertion into the cages 202. To this end, the cages 202 for the second row 248 may permit top insertion to facilitate appropriate connection to the expansion cards 246 in the second row 248.

Cabling assemblies 260 can be utilized to facilitate connection to the expansion cards 246 in the second row 248. For example, in FIG. 2, the cabling assembly 260 includes a cable 266 having a terminating end coupled with a second plug 206 (which may be an example of the second plug 106 of FIG. 1) and an opposite, originating end coupled with a receptacle 262 (which may be an example of the cage 102 and/or a replica of the cage 202).

The receptacle 262 includes appropriate structure for permitting end insertion of a first plug 204. The receptacle 262 can also be coupled with an attachment panel 264 or other suitable structure for mounting the receptacle 262 at an appropriate location. For example, the receptacle 262 can be mounted adjacent the front wall 242 and in alignment with an aperture 256 that forms a portion of a port 258 for receiving a first plug 204. The receptacles 262 being freely mountable may provide versatility to mount in any convenient available space or any arrangement, such as distributed or clustered along the front wall 242.

The second plug 206 includes appropriate structure for top insertion in a cage 202 feeding an expansion card 246 of the second row 248. Thus, in use, a given cable assembly 260 may have the second plug 206 installed relative to the second row 248 and through the top of a cage 202 to connect to a corresponding expansion card 246 in the second row 248. The cable 266 may be routed over the second row 248 and front row 244 toward the front wall 242. An opposite end of the cable assembly 260 may have the receptacle 262 installed in alignment with a port 258 at the front wall 242. As a result of such placement, engaging a first plug 204 in the receptacle 262 will electrically connect the first plug 204 via the cable 266 and second plug 206 through the cage 202 to the expansion card 246 in the second row 248.

The cable assembly 260 may function as an adaptor between different forms of plugs and receiving structures. For example, in use, the cable assembly 260 may receive an end-insertable plug in the receptacle 262 and provide connection at an opposite end through the second plug 206 to facilitate top-insertion. Additionally or alternatively, the cable assembly 260 may accommodate different or matching types of pluggable modules or transceivers at opposite ends. For example, if the second plug 206 is sized for and includes appropriate features for engaging a first receiving portion of a connector interface for a SFP-type of pluggable transceiver, the opposite end of the cable assembly 260 may include a second receiving portion that in one embodiment likewise matches the SFP-type of pluggable transceiver or in a different embodiment instead is configured for receiving a different pluggable transceiver such as a QSFP-type.

Moreover, although discussion herein primarily references cages 202 oriented toward either the front or a rear of the server chassis assembly 240, elements described herein more generally may be oriented in any direction or set of directions, such as to allow standardized plugs to be received through conveniently located receptacles and thereby connected to relatively less easily reached locations via other types of connections such as top-insertion varieties. For example, although FIG. 2 illustrates ports 258 arranged along a front wall 242 of the server chassis assembly 240 to receive end-inserted plugs therein, similar ports 258 could additionally or alternatively be positioned along a rear wall, side wall, or top or bottom of the server chassis assembly 240 and connected via suitable adaptors (such as cable assemblies 260) to other connection points within the server chassis assembly 240.

A plug installed via top insertion may be retained in engagement by a retainer. Various examples of suitable retainers are described in FIGS. 3-11. Various of such features for retainers can be used individually or collectively to accomplish the function of the retainer. In various aspects, the retainer may be distinct or separate from retention mechanisms (such as biased teeth 375 in FIG. 3) for retaining a plug installed via end insertion.

Figure 3:
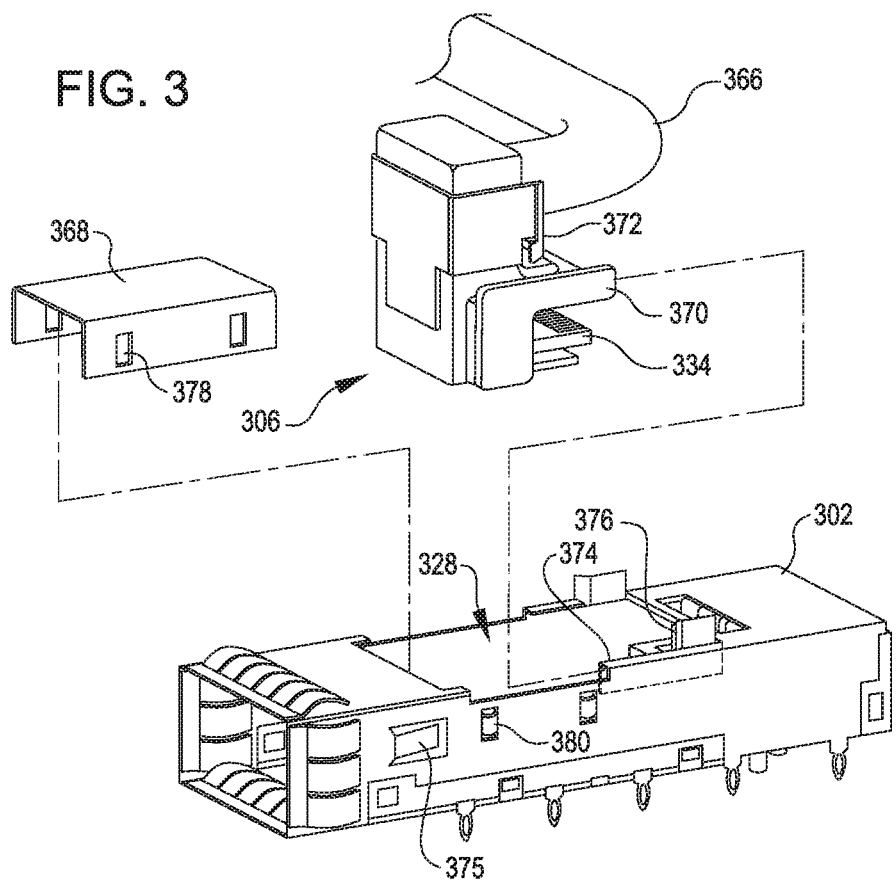
FIG. 3 illustrates a cage with a cover removed and a plug arranged in alignment for insertion into the cage through the top of the cage in accordance with various embodiments.

FIG. 3 illustrates a cage 302 with a cover 368 removed and a plug 306 arranged in alignment for insertion into the cage 302 through a top opening 328 of the cage 302. In use, the cage 302 may be supplied with the cover 368 in place, and the cover 368 may be removed to facilitate insertion of the plug 306. The cover 368, for example, may include notches 378 that engage prongs 380 on the cage 302 for maintaining the cover 368 in position on the cage 302. Prying at the edge of the cover 368 and/or pressing the prongs 380 can cause the prongs 380 to disengage from the notches 378 and allow the cover 368 to be removed.

The plug 306 can be an example of the second plug 106. For example, the cable 366 may extend from the plug 306 to provide a conduit for connection to other relevant components. Although the cable 366 is shown extending out of a side of the plug 306, the cable 366 may alternatively extend out of a top of the plug 306. Additionally, although the cable 366 is shown extending out of the plug 306 on a side from which an insertion portion 334 extends, the cable 366 could alternatively extend from a different side.

The plug 306 in FIG. 3 is shown having a rail 370 and a hook 372. The hook 372 may be resiliently biased, for example, formed at least in part from or coupled with spring steel such that the hook 372 can flex to displace and return to a pre-displaced position in response to engaging another surface such as a ramped surface.

The cage 302 in FIG. 3 is shown having an overhang 374 adjacent to the top opening 328. The overhang 374 may be arranged to facilitate engagement with the rail 370, for example, as described below. The overhang 374 can extend into the top opening 328 and cover at least a portion of the top opening 328.

The cage 302 in FIG. 3 is also shown having a flange 376. The flange 376 may be arranged to facilitate latching engagement with the hook 372, for example, as described below. The flange 376 may extend outwardly from the cage 302.

Figure 4:
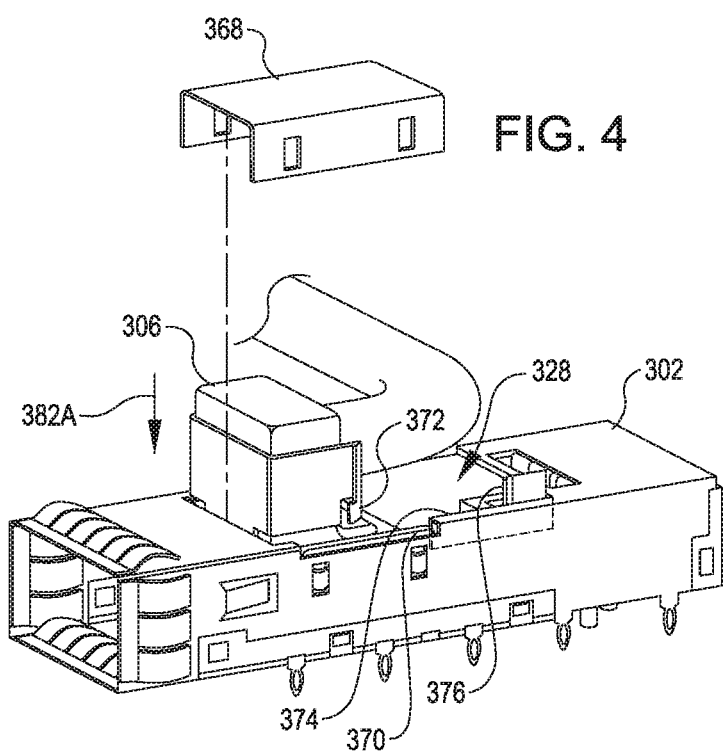
FIG. 4 illustrates components of FIG. 3 with the plug partially received within the cage in accordance with various embodiments.

FIG. 4 illustrates components of FIG. 3 with the plug 306 partially received within the cage 302. For example the plug 306 may move from the position shown in FIG. 3 to the position shown in FIG. 4, such as depicted by arrow 382A. This may correspond to a downward movement of the plug 306 through the top opening 328 of the cage 302.

Insertion of the plug 306 through the top opening 328 to the position shown in FIG. 4 can align respective features of the plug 306 and the cage 302 for subsequent engagement. As one example, in the position shown in FIG. 4, the rail 370 of the plug 306 is shown aligned with the overhang 374 of the cage 302 such that the rail 370 may be positioned to slide underneath the overhang 374. As another example, in FIG. 4, the hook 372 of the plug 306 is aligned with the flange 376 of the cage 302 in a manner that may facilitate subsequent engagement of the flange 376 and hook 372 in response to movement of the plug 306 relative to the cage 302.

Figure 5:
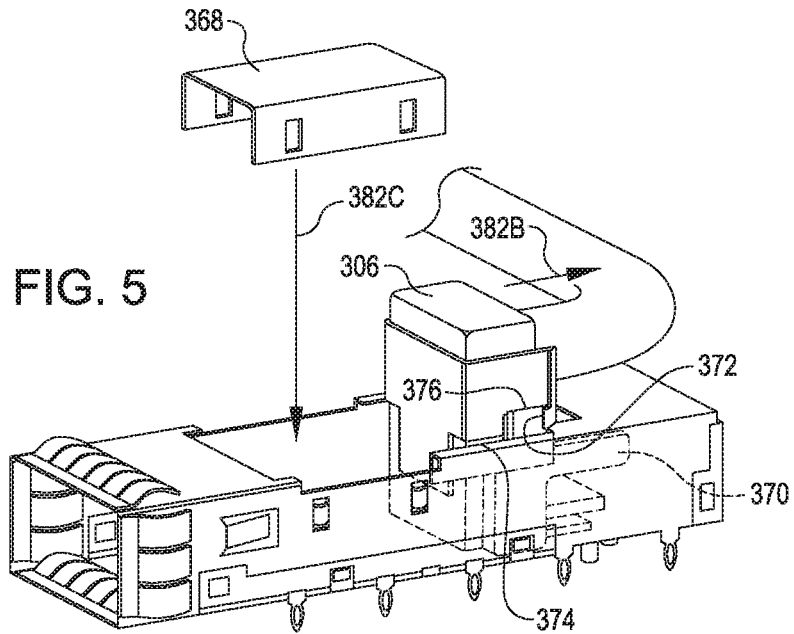
FIG. 5 illustrates the components of FIGS. 3-4 with the plug engaged within the cage in accordance with various embodiments.

FIG. 5 illustrates the components of FIGS. 3-4 with the plug 306 engaged within the cage 302. For example, the plug 306 may move as depicted by arrow 382B from the position shown in FIG. 4 to the position shown in FIG. 5. This may correspond to a subsequent translation by the plug 306 in the longitudinal direction of the cage 302, e.g., subsequent to the earlier insertion of the plug 306 in a vertical direction depicted by arrow 382A into the cage 302. In the position shown in FIG. 5, the insertion portion 334 of the connector interface of the plug 306 may engage within the cage 302 and establish a connection for transfer of data and/or power.

Movement by the plug 306 in the longitudinal direction of the cage 302 (e.g., depicted by arrow 382B) can cause engagement of the hook 372 of the plug 306 with the flange 376 of the cage 302. For example, as the plug 306 is moved forward, a ramp of the hook 372 may engage a ramp of the flange 376 to cause the flexion of the hook 372. As the hook 372 passes the flange 376 during movement of the plug 306, resiliency of the hook 372 or associated structure can cause the hook 372 to flex back into an un-deflected position and into engagement around the flange 376.

Stated another way, the hook 372 and flange 376 may serve as corresponding latching parts of a retainer for preventing backwards translation of the plug 306 away from an engaged state. Disengagement from such an engaged state can be accomplished by depressing the hook 372 to cause disengagement from the flange 376 to allow backwards translation for removal (e.g., in the direction opposite the arrow 382B).

Additionally, movement of the plug 306 forward as depicted by arrow 382B can cause engagement of the rail 370 of the plug 306 with the overhang 374 of the cage 302. For example, in the state shown in FIG. 5, the rail 370 is captured by the overhang 374. In the arrangement shown, the overhang 374 is shaped to mate against multiple sides of the rail 370 and prevent lateral and vertical movements of the plug 306. In some aspects, the overhang 374 solely extends over a top side of the rail 370 and not downward along the lateral side thereof. The overhang 374 may prevent vertical or up and down dislocation of the rail 370 and thereby prevent vertical displacement of the plug 306 from the engaged state within the cage 302. In embodiments in which the overhang 374 does extend along a lateral side of the rail 370 in engagement, the rail 370 and overhang 374 may prevent the plug from lateral movement in addition to vertical movement.

Thus, the combination of the rail 370 and the overhang 374 may be an example of a retainer, e.g., which may prevent movement of the plug 306 in a vertical direction from an engaged state of the plug 306. Similarly, the hook 372 and flange 376 are additional examples of subcomponents of a retainer. Although respective elements have been described as being on the plug 306 or the cage 302, features may be reversed to be present on the opposite component. For example, in some embodiments, a flange 376 may be instead included on the plug 306 while a hook 372 is instead included on the cage 302.

Figure 6:
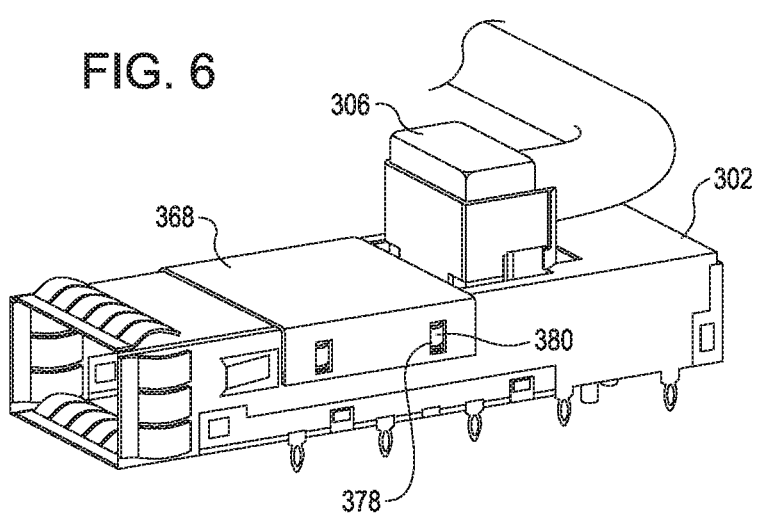
FIG. 6 illustrates the components of FIGS. 3-5 with the cover installed on the cage in a position retaining the plug in engagement within the cage in accordance with various embodiments.

FIG. 6 illustrates the components of FIGS. 3-5 with the cover 368 installed on the cage 302 in a position retaining the plug 306 in engagement within the cage 302. For example, the cover 368 may be moved from the position shown in FIG. 5 to that shown in FIG. 6, e.g., as illustrated by arrow 382C in FIG. 5. Reinstalling the cover 368 after the plug 306 is engaged in the cage 302 can hold the plug 306 in place relative to the cage 302.

The cover 368 installed on the cage 302 in FIG. 6 may stay in place based on engagement of the prongs 380 from the cage 302 with the notches 378 on the cover 368. Thus, notches 378 and prongs 380 are another example of a retainer capable of holding the plug 306 in an engaged state relative to the cage 302. Additionally, although notches 378 have been described relative to the cover 368 and the prongs 380 have been described relative to the cage 302, such an arrangement could be reversed in part or in whole, such that at least some of the prongs 380 are on the cover 368 and at least some corresponding notches 378 are on the cage 302.

Figure 7:
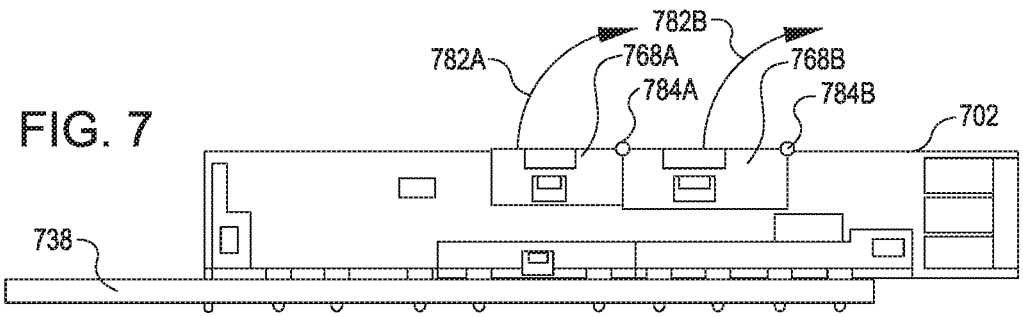
FIG. 7 illustrates a side view of a cage having a cover that is hinged in accordance with various embodiments.

FIG. 7 illustrates a side view of a cage 702 having a cover 768 that is hinged. The cage 702 is shown mounted to a circuit board 738. In FIG. 7, the cover 768 includes a first cover portion 768A and a second cover portion 768B. The cover 768 is also shown with a first hinge 784A between the first cover portion 768A and the second cover portion 768B. A second hinge 784B is also depicted attaching the cover 768 to the cage 702.

In operation, the cover 768 may be displaced by rotating the first portion 768A as depicted by arrow 782A and by rotating the second cover portion 768B, such as depicted by arrow 782B. Displacing the cover 768 may expose an opening through the top of the cage 702. For example, rotating the portions of the cover 768 may cause the cover 768 to move from the position shown in FIG. 7 to the position shown in FIG. 8.

Figure 8:
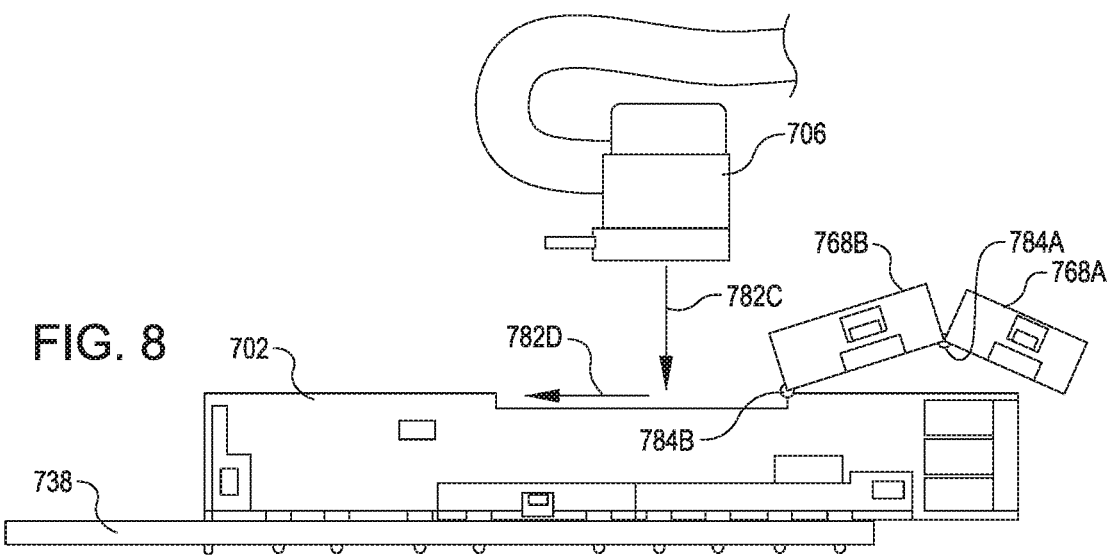
FIG. 8 illustrates the components of FIG. 7 with the cover in a displaced position allowing insertion of the plug in accordance with various embodiments.

FIG. 8 illustrates the components of FIG. 7 with the cover 768 in a displaced position allowing insertion of a plug 706. In FIG. 8, the cover 768 is displaced relative to the cage 702 to allow insertion of the plug 706 through a top of the cage 702 (e.g. as depicted by arrow 782C). Upon insertion of the plug 706 in the vertical direction depicted by arrow 782C, the plug 706 can be translated forward (such as illustrated by arrow 782D). Such forward translation may cause the plug 706 to move into an engaged state within the cage 702.

Figure 9:
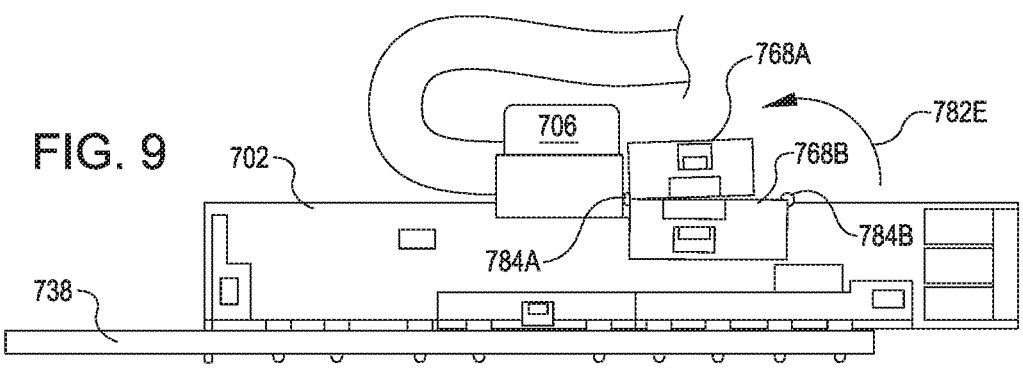
FIG. 9 illustrates the components of FIGS. 7-8 with the plug engaged in the cage and retained, at least in part, by placement of the cover in a closed position in accordance with various embodiments.

FIG. 9 illustrates the components of FIGS. 7-8 with the plug 706 engaged in the cage 702 and retained, at least in part, by placement of the cover 768 in a closed position. The cover 768 can hingedly rotate to retain the plug 706 in the engaged state within the cage 702. For example, as illustrated by arrow 782E, the second cover portion 768B may rotate about the second hinge 784B to occupy or block a space behind the engaged plug 706 and prevent the plug 706 from backing out from such engagement. Thus, the cover 768 is another example of a retainer. The rotation depicted by arrow 782E may also cause the first cover portion 768A to rotate about the first hinge 784A and stack on top of the second cover portion 768B.

Additionally, although the cover 768 in FIGS. 7-9 is shown having both the first cover portion 768A and the second cover portion 768B, in some aspects the first cover portion 768A can be omitted along with first hinge 784A. For example, the cover 768 may be provided solely as a retainer to block a portion of the top opening left unoccupied when the plug 706 is engaged rather than also including sufficient size to cover the entire top opening in the absence of the plug 706.

Figure 10:
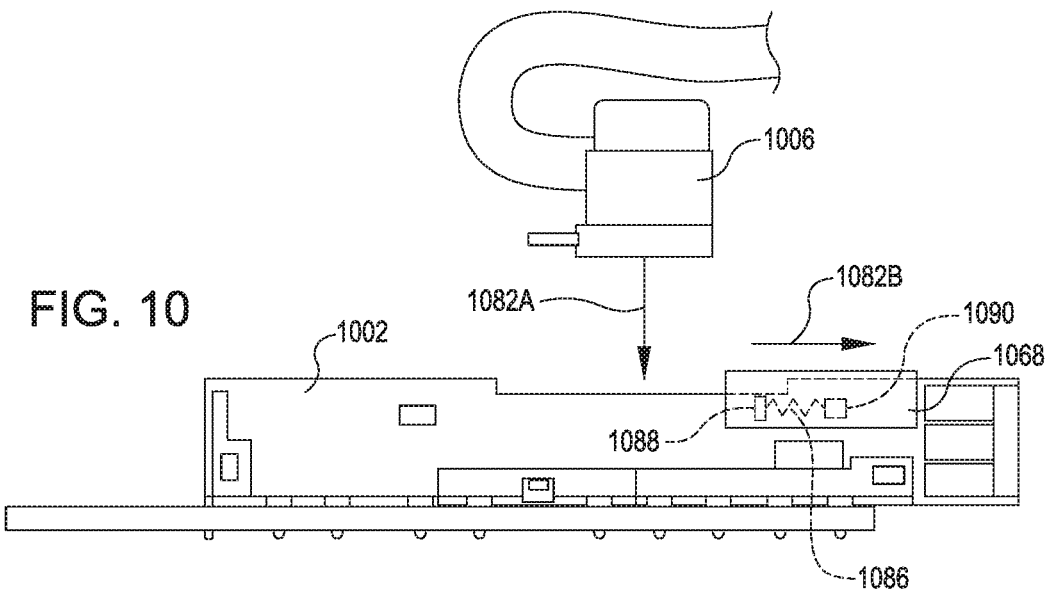
FIG. 10 illustrates a side view of a cage with a sliding cover displaced to permit a plug to be inserted into the cage in accordance with various embodiments.

FIG. 10 illustrates a side view of a cage 1002 with a sliding cover 1068 displaced to permit a plug 1006 to be inserted into the cage 1002. The cover 1068 may be translated in a longitudinal direction (such as depicted by arrow 1082B) from an initial state to make room for the plug 1006 to enter through the top of the cage 1002. For example, the plug 1006 may be inserted in the vertical direction as depicted by arrow 1082A. The movement of the cover 1068 in the sliding or translating direction illustrated by arrow 1082B, for example, may cause a compression or other storage of energy in a biasing mechanism 1086 that may be anchored or coupled to the cover 1068 at a cover anchor point 1088 and anchored to the cage 1002 at cage anchor point 1090.

Figure 11:
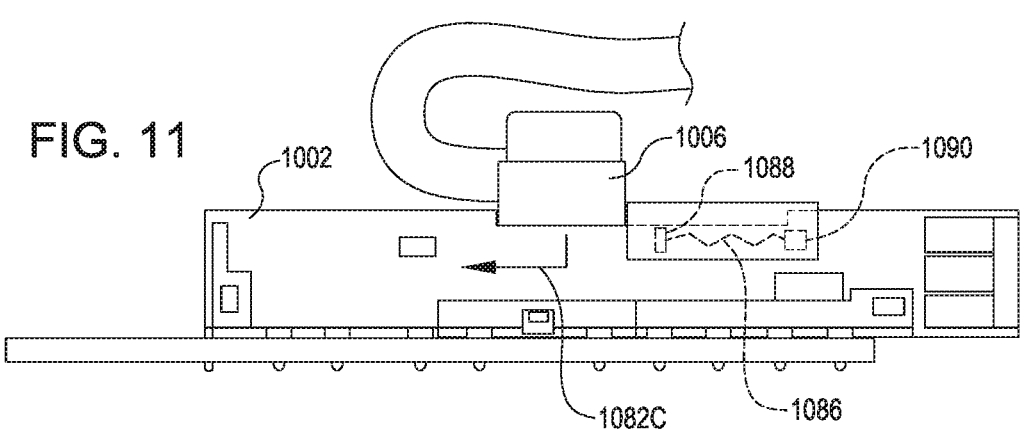
FIG. 11 illustrates the plug engaged in the cage and retained, at least in part, by the sliding cover in accordance with various embodiments.

FIG. 11 illustrates the plug 1006 engaged in the cage 1002 and retained, at least in part, by the sliding cover 1068. The plug 1006 may be moved into the position shown in FIG. 11 by motion depicted by the arrow 1082C. This motion may include a forward motion in the longitudinal direction of the cage 1002 and cause engagement of the plug 1006 within the cage 1002. The sliding cover 1068 can be moved into engagements across a portion of the top side of the cage 1002 through which the plug 1006 was installed. For example, the cover 1068 can be moved into engagement with the plug 1006 and retain the plug 1006 in a engaged state within the cage 1002. Accordingly, the sliding cover 1068 is another example of a retainer.

The sliding cover 1068 may be biased into engagement with the plug 1006 by action of the biasing mechanism 1086 acting on the cover 1068 in response to energy stored by initially displacing the cover 1068 as depicted by arrow 1082B in FIG. 10. In some embodiments, the biasing mechanism 1086 may be omitted, replaced, or supplemented, for example, by latching mechanisms that can lock the cover 1068 in place upon movement of the cover to the position retaining the plug 1006 in engagement with the cage 1002.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system comprising:
   a server chassis assembly having a front wall, a front row of expansion cards behind the front wall and oriented facing the front wall, and a second row of expansion cards behind the front row and oriented facing away from the front wall;
   a cage adjacent to a particular expansion card of the second row and defined by walls extending rearwardly and parallel to a receiving portion of a connector interface of the particular expansion card of the second row; and
   a cable that terminates in a plug having an L-shaped connector that includes a vertical upright column coupled with a horizontal base, the horizontal base including an insertion portion of the connector interface, the cable extending from the vertical upright column, wherein the plug is received in the cage in a position in which the insertion portion of the connector interface is engaged with the receiving portion of the connector interface and in which the plug is positioned extending through an opening in a top of the cage so that the cable extends over the front row of expansion cards and over the second row of expansion cards so as to provide a connection from the particular expansion card of the second row to a port in the front wall.

2. The system of claim 1, wherein the plug is configured to be installed through the opening in the top of the cage via an installation process that includes a first vertical insertion of the plug through the opening in the top of the cage and a second horizontal motion of translating the plug within the cage to bring the insertion portion of the connector interface on the plug into engagement with the receiving portion of the connector interface of the particular expansion card of the second row.

3. The system of claim 1, wherein the connector interface comprises a QSFP interface or a SFP interface.

4. The system of claim 1, wherein the cage comprises a first cage defined by first walls;
   wherein the cable originates from a second cage having second walls that are replicas of the first walls of the first cage; and
   wherein the second cage is positioned behind and adjacent the front wall in alignment with an aperture through the front wall, the aperture forming a portion of the port in the front wall and aligned to permit insertion of a module horizontally into the second cage to provide connection from the module via the cable to the particular expansion card of the second row.

5. A system comprising:
   a cage configured to be attached adjacent to an expansion card, the cage formed by walls and defining a top face, a bottom face, a right face, a left face, a front face, and a rear face;
   a rear portion adjacent the rear face and sized to house a receiving portion of a connector interface for a pluggable transceiver;
   a front opening extending through the front face and sized to permit insertion therethrough of a module for engagement with the receiving portion of the connector interface;
   a top opening extending through the top face and sized to permit insertion therethrough of a plug for engagement with the receiving portion of the connector interface into an engaged position reached by the plug being lowered through the top opening and translated forward underneath the top face; and
   a retainer configured to retain the plug inserted through the top opening in engagement with the receiving portion of the connector interface in the engaged position reached by the plug being lowered through the top opening and translated forward underneath the top face.

6. The system of claim 5, wherein the retainer comprises a displaceable cover configured to block a portion of the top opening.

7. The system of claim 6, wherein the cover is hingedly attached to the cage.

8. The system of claim 6, wherein the cover is slidingly attached to the cage.

9. The system of claim 6, wherein the cover is releasably attached to the cage via engagement of prongs with notches.

10. The system of claim 5, wherein the retainer comprises an overhang extending over a portion of the top opening.

11. The system of claim 5, wherein the retainer comprises a surface extending from the cage and configured to latch with a feature on the plug.

12. The system of claim 5, further comprising:
    a cable having an originating end and a terminating end;
    the plug, the plug being coupled with the terminating end of the cable, the plug comprising a vertical upright column coupled with a horizontal base, the horizontal base including a first insertion portion configured to engage the receiving portion of the connector interface, the cable extending from the vertical upright column; and
    a second receiving portion configured for engaging the pluggable transceiver or configured for engaging a different pluggable transceiver, the second receiving portion coupled with the originating end of the cable.

13. A system comprising:
    a cable having an originating end and a terminating end;
    a plug coupled with the terminating end of the cable, the plug comprising a body having a horizontal base and a vertical upright column coupled with the horizontal base, the horizontal base including a horizontal insertion portion of a connector interface for a pluggable transceiver, the cable extending from the vertical upright column, wherein the plug is configured for facilitating top-down insertion of the plug into an engaged position reached by the plug being lowered through a top opening and translated forward underneath a top face through which the top opening is defined, wherein in the engaged position the vertical upright column extends at least partially above the top opening and the horizontal base is situated at least partially below the top opening; and
    a receiving portion configured for engaging the pluggable transceiver or a different pluggable transceiver via at least one of end-insertion or top-down insertion, the receiving portion coupled with the originating end of the cable.

14. The system of claim 13, further comprising:
    a receptacle arranged at the originating end of the cable and about the receiving portion of the connector interface for the pluggable transceiver.

15. The system of claim 14, wherein the receptacle comprises a cage formed around the receiving portion of the connector interface for the pluggable transceiver, the cage having an opening disposed opposite the receiving portion and sized to facilitate insertion therethrough of a module for engagement with the receiving portion of the connector interface.

16. The system of claim 15, wherein the top face is defined by the cage, wherein the cage comprises the top opening, and wherein the top opening is sized to permit insertion therethrough of the plug for engagement with the receiving portion of the connector interface.

17. The system of claim 13, wherein the connector interface comprises a QSFP interface or a SFP interface.

18. The system of claim 13, wherein the plug includes a rail configured to be received by an overhang so as to prevent vertical displacement of the plug away from an engaged state.

19. The system of claim 13, wherein the plug includes a resiliently biased hook configured to latch so as to prevent horizontal displacement of the plug away from an engaged state.

20. The system of claim 13, further comprising:
a server chassis assembly having a front wall, a front row of expansion cards behind the front wall, and a second row of expansion cards behind the front row; and
a cage defined by walls extending rearwardly and parallel to a receiving portion of a connector interface of a particular expansion card of the second row;
wherein the cable is arranged relative to the server chassis assembly such that the plug is installed through an opening in a top of the cage so that the cable extends over the front row of expansion cards and over the second row of expansion cards so as to provide a connection from the particular expansion card of the second row to a port in the front wall.

21. The system of claim 5, wherein at least one cage wall that at least partially defines the top opening further comprises an extension or surface defining at least a portion of the retainer, wherein the extension or surface includes or defines:
a flange for engaging a hook of the plug;
a hook for engaging a flange of the plug;
an overhang for engaging a rail of the plug;
a rail for engaging an overhang of the plug;
a prong to engage a notch in a cover sized to at least partially block the top opening and prevent sliding of the plug within the opening; or
a notch to engage a prong in a cover sized to at least partially block the top opening and prevent sliding of the plug within the opening.

\* \* \* \* \*